United States Patent [19]

Katoh

[11] Patent Number: 5,187,377
[45] Date of Patent: Feb. 16, 1993

[54] LED ARRAY FOR EMITTING LIGHT OF MULTIPLE WAVELENGTHS

[75] Inventor: Masaaki Katoh, Osaka, Japan

[73] Assignee: Sharp Kabushiki Kaisha, Osaka, Japan

[21] Appl. No.: 810,366

[22] Filed: Dec. 17, 1991

Related U.S. Application Data

[63] Continuation of Ser. No. 362,055, Jun. 6, 1989, abandoned.

[30] Foreign Application Priority Data

Jul. 15, 1988 [JP] Japan .............................. 63-94388[U]

[51] Int. Cl.$^5$ ............................................. H01L 33/00
[52] U.S. Cl. ........................................ 257/89; 257/98;
257/99; 257/918; 362/800; 307/311
[58] Field of Search ................... 357/17, 45; 307/311,
307/317.1; 313/500; 340/762, 760; 362/800,
310; 315/192, 312, 324

[56] References Cited

U.S. PATENT DOCUMENTS

| 3,942,065 | 3/1976 | Russ | 357/17 |
|---|---|---|---|
| 4,298,869 | 11/1981 | Okuno | 357/17 |
| 4,329,625 | 5/1982 | Nishizawa et al. | 362/800 |
| 4,755,807 | 7/1988 | Guennou | 340/762 |
| 4,901,207 | 2/1990 | Sato et al. | 362/800 |
| 4,939,426 | 7/1990 | Menard et al. | 362/800 |
| 4,963,798 | 10/1990 | McDermott | 315/192 |
| 4,965,457 | 10/1990 | Wrobel et al. | 362/800 |
| 5,008,788 | 4/1991 | Palinkas | 362/800 |

FOREIGN PATENT DOCUMENTS

| 55-150282 | 11/1980 | Japan | 357/17 |
|---|---|---|---|
| 56-112054 | 9/1981 | Japan | 313/500 |
| 58-222578 | 12/1983 | Japan | 357/17 |
| 59-79679 | 5/1984 | Japan | 340/762 |
| 60-146568 | 8/1985 | Japan | 340/762 |
| 61-84077 | 4/1986 | Japan | 357/17 |
| 61-102077 | 5/1986 | Japan | 357/17 |
| 63-131585 | 6/1988 | Japan | 357/17 |
| 2-386 | 1/1990 | Japan | 357/17 |
| 2-154481 | 6/1990 | Japan | 357/17 DC |
| 2-215171 | 8/1990 | Japan | 357/17 |

Primary Examiner—Rolf Hille
Assistant Examiner—Minhloan Tran
Attorney, Agent, or Firm—Morrison & Foerster

[57] ABSTRACT

An LED array comprising a substrate, a plurality of first LEDs, and a plurality of second LEDs, wherein the range of wavelengths of light from the first LEDs is different from the range of wavelengths of light from the second LEDs; the first LEDs and the second LEDs are respectively connected in series so that a current alternatively flows through the first LEDs and the second LEDs in the opposite directions; the first LEDs connected in series and the second LEDs connected in series are further connected in parallel; and the first LEDs and second LEDs are arranged in a line on the substrate.

3 Claims, 4 Drawing Sheets

LED ARRAY FOR EMITTING LIGHT OF MULTIPLE WAVELENGTHS

This application is a continuation of application Ser. No. 362,055, filed Jun. 6, 1989, now abandoned.

BACKGROUND OF THE INVENTION

1. Field of the invention

This invention relates to an LED (light-emitting-diode) array, which can be used as a light source in a facsimile apparatus, a handy scanner, and the like.

2. Description of the prior art

In a conventional LED array which has been used as a light source in a contact-type linear image sensor, a plurality of LEDs which emit light beams of wavelengths lying in a certain range are arranged in a line on a slat-shaped substrate. The light beams from the LEDs are converged by a rod lens which is placed at a fixed spacing from the LEDs, so as to illuminate an original. The reflected light beams from the original are received by the contact-type linear image sensor, so that the image information in the original is read by the contact-type linear image sensor.

In the LED array of this type, an LED which emits green light of a wavelength of 555 nm or an LED which emits yellowish-green light of a wavelength of 565 nm is generally used. Although these LEDs are disadvantageous in that their output power is comparatively low, they are capable of emitting light beams which are absorbed by portions colored in red in the original, so that they are applicable to a light source in an image sensor used in a facsimile apparatus or the like.

An LED which is capable of emitting red light of the wavelength of 635 nm has also been developed. This LED is advantageous in that its output power is high, but there is a problem that light from the LED is reflected by red portions in the original. The red light is reflected on the original, the surface of which is colored in white, so that it is impossible for an image sensor to identify these red portions in the original For this reason, the LED is not used in an LED array which serves as a light source in an image sensor used in a facsimile apparatus or the like.

Thus, when a conventional LED array is applied to a light source in an image sensor used in a facsimile apparatus or the like, only one type of LED which emits light that is absorbed by the red portions is used. When the image in the original is constituted by black portions and red portions, and the original is subjected to the reading process with the image sensor using the LED of this type, both the black portions and the red portions are read by the image sensor, even when it is only necessary to read the black portions, and the red portions need not be read. In this case, the unnecessary red portions in the original must be eliminated in advance, which makes the reading process intricate.

When the above-mentioned LEDs for emitting red light, which is reflected by the red portions because of its wavelength, is used in the LED array, the red portions in the original reflect the red light, so that the image sensor is not capable of reading the red portions. Thus, when the LED array is provided with the LEDs for emitting green or yellowishgreen light and the LEDs for emitting red light, the original is irradiated with red light, if desired, as well as green or yellowish-green light, so that application of the facsimile apparatus or the like in which the LED array is used is enlarged, and various requirements of users can be fulfilled.

However, in order to obtain an LED array in which different types of LEDs are used to alternatively emit light beams at wavelengths in the different ranges by changing the direction of current-flow, a number of lead wires are necessary, resulting in an LED array with complicated wiring.

SUMMARY OF THE INVENTION

The LED array of this invention, which overcomes the above-discussed and numerous other disadvantages and deficiencies of the prior art, comprises a substrate, a plurality of first LEDs, and a plurality of second LEDs, said first and second LEDs being arranged in a line on said substrate, wherein the range of wavelengths of light from said first LEDs is different from the range of wavelengths of light from said second LEDs; said first LEDs and said second LEDs are respectively connected in series so that a current alternatively flows through said first LEDs and said second LEDs in the opposite direction; and said first LEDs and said second LEDs are further connected in parallel.

In a preferred embodiment, the LED array is used as a light source in a contact-type linear image sensor. The contact-type linear image sensor is used in a facsimile apparatus.

In a preferred embodiment, the first LEDs emit green light and said second LEDs emit red light.

Thus, the invention described herein makes possible the objectives of (1) providing an LED array which comprises different types of LEDs to emit light beams of wavelengths lying in different ranges, so that only one type of LEDs emit light at a time by changing the direction of current-flow; and (2) providing an LED array having a simple structure, with which light beams of different colors can be easily obtained.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
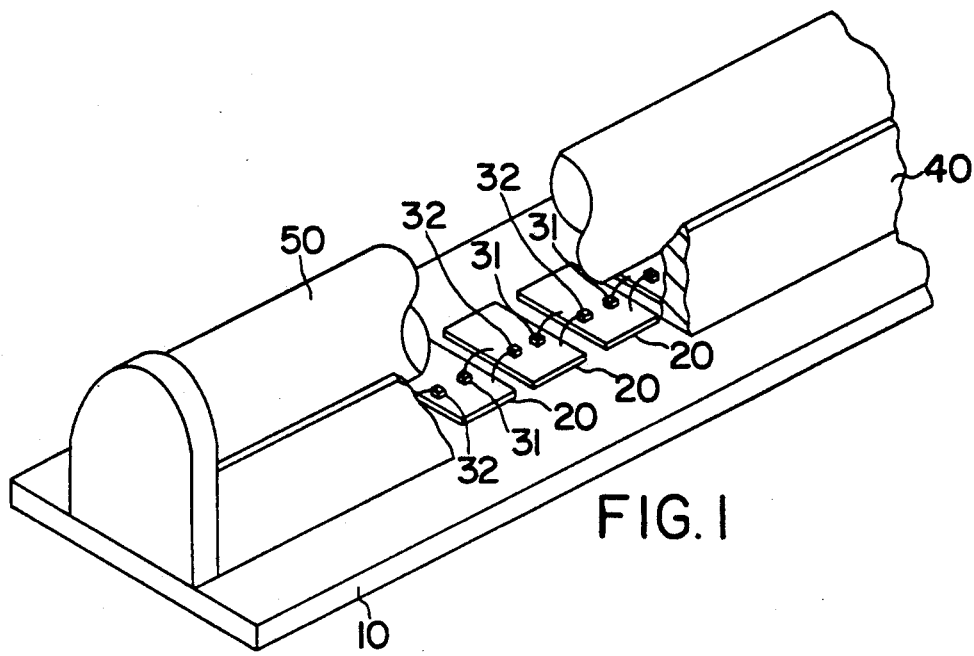
FIG. 1 is a perspective view showing the main portion of an LED array of the invention.

FIG. 1 shows an LED array of the invention, which comprises a substrate 10 in the shape of a rectangular parallelepiped, a plurality of metal plates 20 which are arranged in a line on the substrate 10, the first LEDs 31 which emit light of the wavelength of 565 nm, the second LEDs 32 which emit light of the wavelength of 635 nm, a pair of reflection plates 40 (only one plate is shown in the figure), and a rod lens 50. The metal plates 20 are regularly spaced in the long direction of the substrate 10, and on the top of each of the metal plates 20 are a pair of first LED 31 and second LEDs 32 disposed along the length of the substrate 10, so that all the LEDs on the metal plates 20 are arranged in a line. The top face of each of the first and second LEDs function as a light-emitting face, and the top face of the first LED is connected to one adjacent metal plate 20 while the top face of the second LED is connected to the next adjacent metal plate 20.

The pair of reflection plates 40 are disposed on the substrate 10, in such a manner that the LEDs 31 and 32 arranged in a line are interposed between the pair of reflection plates 40. The reflection plates 40 support the rod lens 50 which extends in the same direction that the LEDs 31 and 32 are arranged. There is a fixed spacing between the rod lens 50 and the LEDs 31 and 32 disposed on the substrate 10.

Figure 2:
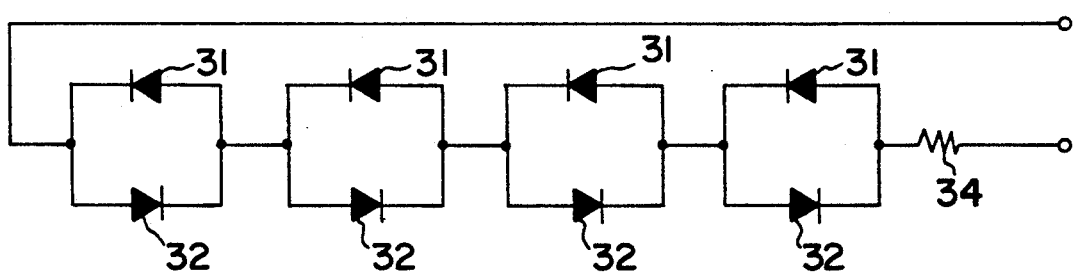
FIG. 2 is an equivalent circuit of the LED array of FIG. 1.

FIG. 2 is an equivalent circuit of the LED array described above. In the figure, the LEDs 31 which emit green light are connected in series via the metal plates 20 so that a current flows through the LEDs 31 in one direction, while the LEDs 32 which emit red light are connected in series via the metal plates 20 so that the current flows through the LEDs 32 in the opposite direction that the current flows through the LEDs 31. The LED 31 disposed on one metal plate 20 and the LED 32 disposed on its adjacent metal plate 20 are connected in parallel. Since the LEDs 31 and 32 are made of a semiconductor material, the current is allowed to flow through the LED 31 or 32 only in one direction. Therefore, when voltage is applied to the LED array of the invention, the current is allowed to flow through only one type of LEDs in the LED array, so that light is emitted only from the LEDs through which the current flows. This means that the type of LEDs which emit light is determined by the direction of current-flow, so that light obtained from the LED array at any one time is either green or red. A resistance 34 is used to adjust luminance of light from the LED array.

Figure 3:
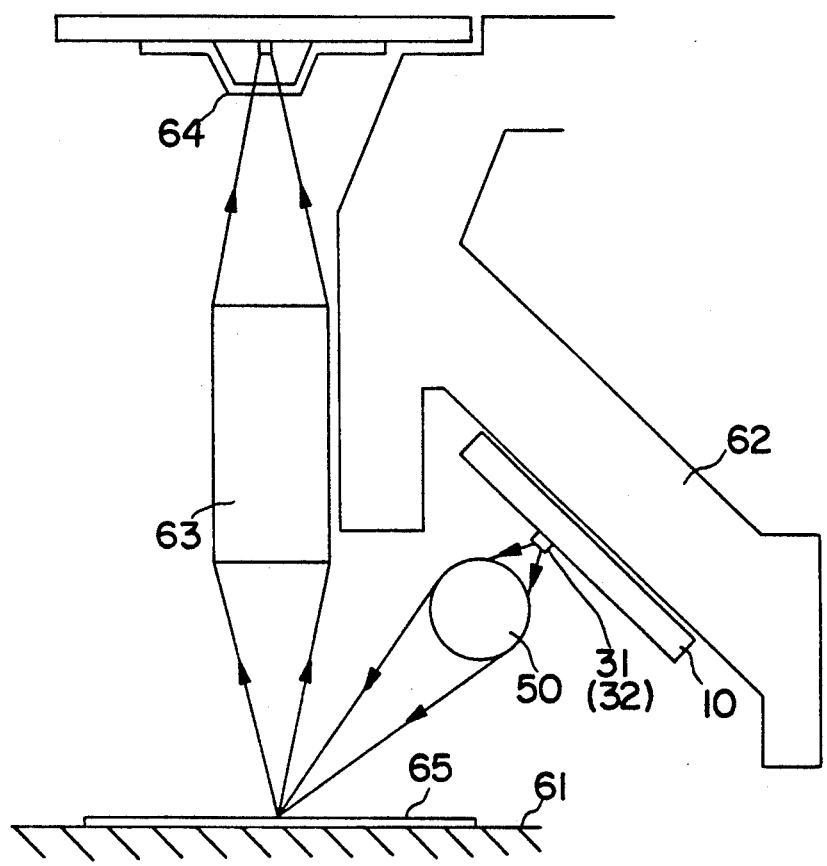
FIG. 3 diagrammatically shows an image sensor unit using the LED array of FIG. 1.

FIG. 3 shows a cross section of a contact-type linear image sensor, which is used in combination with the LED array of the invention, an original stand 61, a base 62, and a rod lens 63 for converging light. In the figure, an original 65 is disposed on the original stand 61, and the LED array is positioned in such a manner that the rod lens 50 faces the original 65 from above at a fixed angle with respect to the original 65, so that the original 65 disposed on the original stand 61 is irradiated with light from the LED array. The substrate 10 of the LED array is attached to the base 62 made of aluminum, and light beams from the LED 31 or 32 illuminate the original 65 on the original stand 61 via the rod lens 50. The reflected light from the original 65 is converged onto the contact-type image sensor 64 by means of the rod lens 63 for converging light, so that the original image is read by the contact-type image sensor 64. Then, the reproduction is obtained on the basis of results of the detection carried out by the contact-type image sensor 64.

Figure 4:
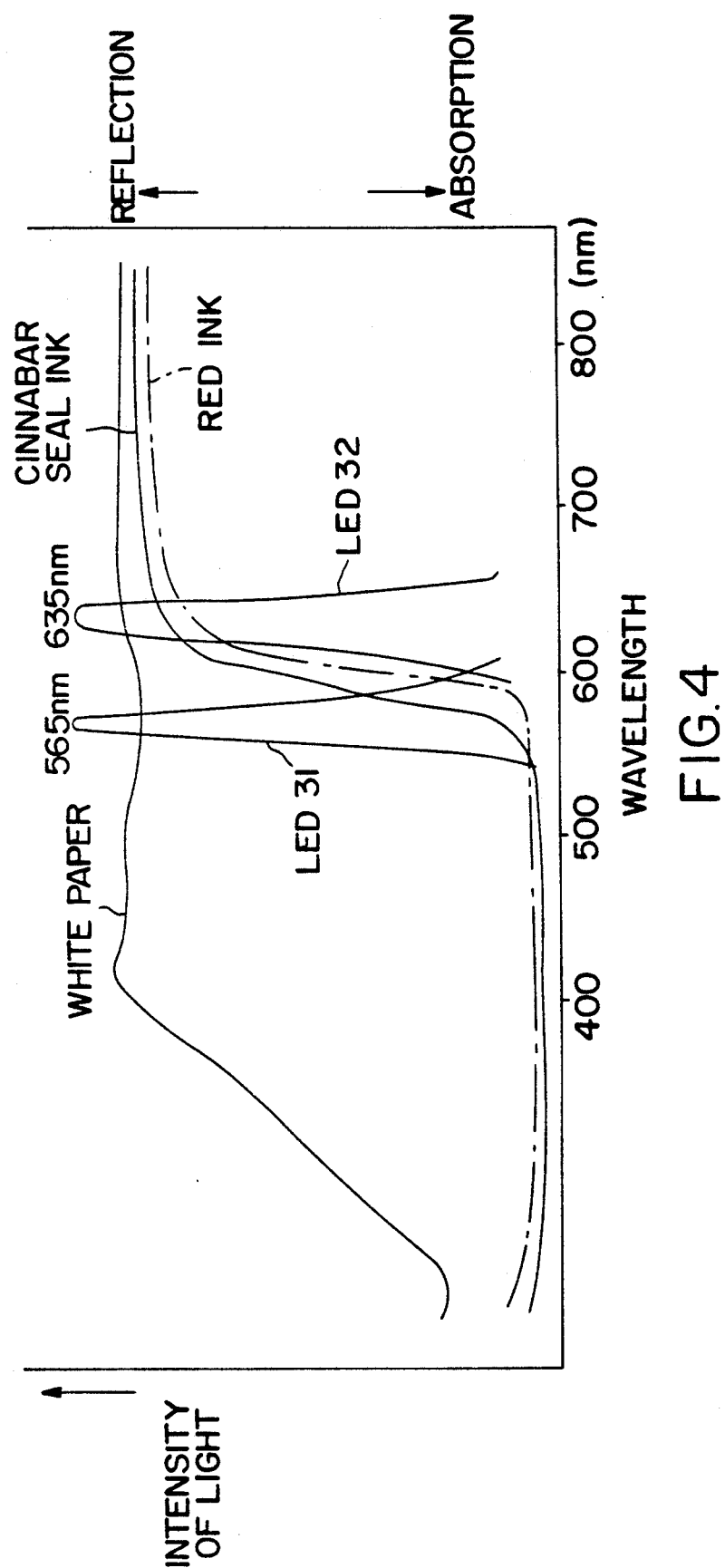
FIG. 4 is a graph showing the relationship between the wavelengths and intensity of light from the LEDs used in the LED array of FIG. 1.

FIG. 4 shows the relationship between the wavelengths and intensity of light from the LEDs 31 and 32. The figure also shows the ranges of wavelengths in which light is reflected or absorbed by white paper, cinnabar seal ink, and red ink. When the LED 31 of the LED array of the invention emits green light, its intensity reaches the peak at the wavelength of 565 nm, so that the green light is absorbed by cinnabar seal ink and red ink, and is not reflected by these red pigments. By contrast, when the LED 32 of the LED array emits red light, its intensity reaches the peak at the wavelength of 635 nm, so that the red light is reflected by cinnabar seal ink and red ink. When it is necessary to reproduce the red portions of the original, the current is allowed to flow only in one direction through the LEDs 31 for emitting green light, so that the original 65 is irradiated with green light, which is absorbed by the red portions in the original, and the image sensor 64 can identify the red portions in the original, the surface of which is colored in white, with certainty.

On the other hand, when it is not necessary to reproduce the red portions of the original, the current is allowed to flow in the other direction through the LEDs 32 for emitting red light, so that the original 65 is irradiated with the red light. In this case, however, the red light is reflected by the red portions as well as the white of the original 65, and the image sensor 64 cannot identify the red portions in the original so that the reproduced image without the portions which correspond to the red portions in the original is obtained on the basis of results of the detection.

Figure 5:
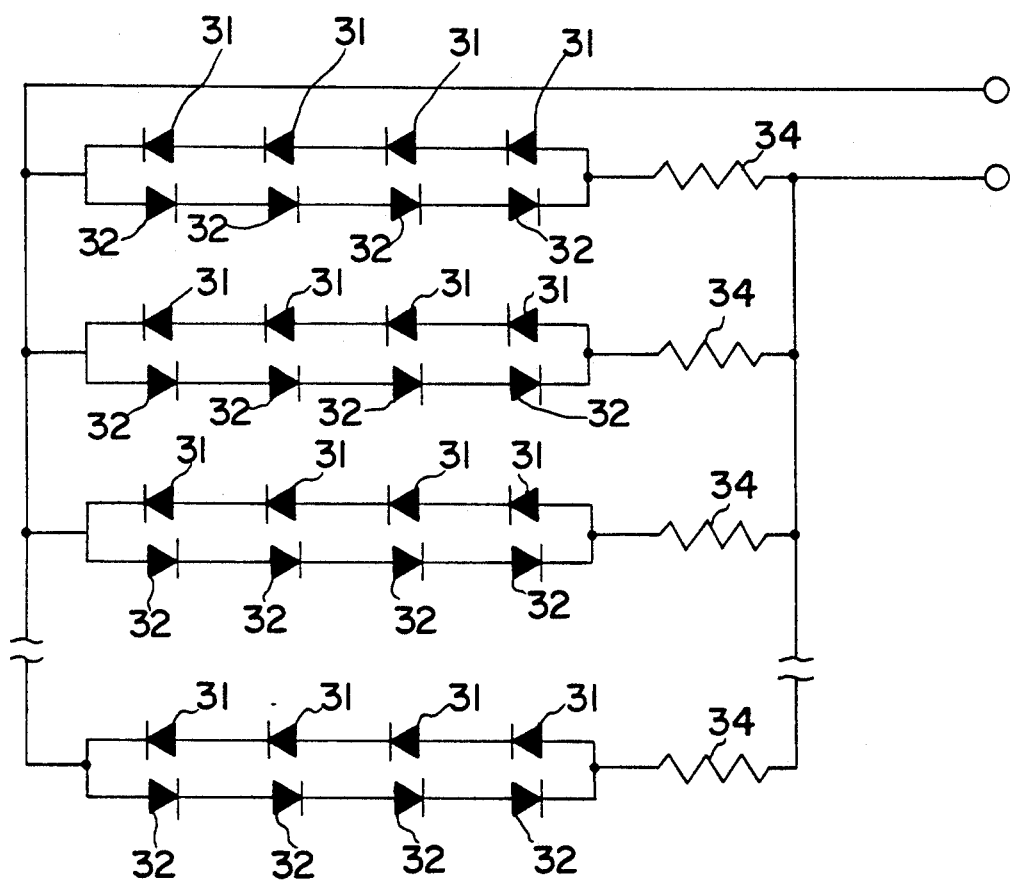
FIG. 5 is an equivalent circuit of another LED array of the invention.

FIG. 5 is an equivalent circuit of another LED array of the invention. With the LED array of this type, a plurality of series circuits of the first LEDs 31 for emitting green light and a plurality of series circuits of the second LEDs 32 for emitting red light are connected in parallel, and these parallel circuits and resistances 34 for adjusting luminance of light are further connected to constitute a plurality of series circuits, which, in turn, are connected to each other in parallel. It is also possible to allow the LEDs 31 alone to emit green light or the LEDs 32 alone to emit red light by changing the direction of current-flow in the LED array.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An LED array for use as a light source in a contact-type linear image sensor, the LED array comprising a substrate, a pair of reflection plates, a rod lens covering the reflection plates, the reflection plates and the rod lens being mounted on the substrate, a plurality of electrodes spaced at equal intervals between the pair of reflection plates, and multiple pairs of a first LED and a second LED disposed on the respective electrodes in such a manner that the first LED and the second LED are connected in parallel, the first LED and the second LED having different ranges of wavelength, the LED pairs being connected in series wherein the first LEDs and the second LEDs are arranged in opposite directions relative to each other so that currents flow through the first LEDs and the second LEDs in opposite directions whereby either the first or the second LEDs emit light depending upon the direction of current flow.

2. An LED array according to claim 1, wherein each series of LED pairs includes a single resistance for adjusting luminance of light.

3. An LED array according to claim 1, wherein the first LEDs emit green light and the second LEDs emit red light.

* * * * *